US012787835B2

(12) United States Patent
Haba

(10) Patent No.: US 12,787,835 B2
(45) **Date of Patent: *Nov. 3, 2026**

(54) BONDED STRUCTURE WITH INTERCONNECT STRUCTURE

(71) Applicant: ADEIA SEMICONDUCTOR BONDING TECHNOLOGIES INC., San Jose, CA (US)

(72) Inventor: Belgacem Haba, Saratoga, CA (US)

(73) Assignee: Adeia Semiconductor Bonding Technologies Inc., San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 19/218,114

(22) Filed: May 23, 2025

(65) Prior Publication Data

US 2026/0053016 A1 Feb. 19, 2026

Related U.S. Application Data

(63) Continuation of application No. 18/451,388, filed on Aug. 17, 2023, now Pat. No. 12,322,718, which is a (Continued)

(51) Int. Cl.
*H01L 23/48* (2006.01)
*H01L 23/52* (2006.01)

(Continued)

(52) U.S. Cl.
CPC ........ *H10W 70/685* (2026.01); *H10W 70/611* (2026.01); *H10W 72/0198* (2026.01);

(Continued)

(58) Field of Classification Search
CPC . H01L 24/08; H01L 23/3121; H01L 23/5383; H01L 24/05; H01L 24/80;

(Continued)

(56) References Cited

U.S. PATENT DOCUMENTS 9,087,832 B2 7/2015 Huang et al.
9,165,793 B1 10/2015 Wang et al.

(Continued)

FOREIGN PATENT DOCUMENTS

CN 103515326 B 4/2017
CN 217507310 U 9/2022

(Continued)

OTHER PUBLICATIONS

Anysilicon; "Understanding CoWoS Packaging Technology". (2011) available online at https://anysilicon.com/cowos-pakage/ downloaded Oct. 7, 2024 in 11 pages.

(Continued)

*Primary Examiner* — Niki H Nguyen

(74) *Attorney, Agent, or Firm* — Knobbe, Martens, Olson & Bear, LLP

(57) ABSTRACT

A bonded structure is disclosed. The bonded structure can include an interconnect structure. The bonded structure can also include a first die directly bonded to the interconnect structure. The bonded structure can also include a second die mounted to the interconnect structure. The second die is spaced apart from the first die laterally along an upper surface of the interconnect structure. The second die is electrically connected with the first die at least partially through the interconnect structure. The bonded structure can further include a dielectric layer that is disposed over the upper surface of the interconnect structure between the first die and the second die.

20 Claims, 7 Drawing Sheets

Related U.S. Application Data continuation of application No. 17/171,531, filed on Feb. 9, 2021, now Pat. No. 11,764,177.

(60) Provisional application No. 63/074,928, filed on Sep. 4, 2020.

(51) Int. Cl.

| | |
|---|---|
| ***H01L 29/40*** | (2006.01) |
| ***H10W 70/60*** | (2026.01) |
| ***H10W 70/685*** | (2026.01) |
| ***H10W 72/00*** | (2026.01) |
| ***H10W 74/10*** | (2026.01) |
| ***H10W 90/00*** | (2026.01) |
| ***H10W 99/00*** | (2026.01) |
| *H10W 72/90* | (2026.01) |

(52) U.S. Cl.
CPC .......... *H10W 74/114* (2026.01); *H10W 90/00* (2026.01); *H10W 99/00* (2026.01); *H10W 72/952* (2026.01); *H10W 90/794* (2026.01)

(58) Field of Classification Search
CPC ..... H01L 24/96; H01L 24/97; H01L 25/0655; H01L 2224/05647; H01L 2924/14; H01L 2924/181; H01L 2224/48247; H01L 2924/15311; H01L 2224/04042; H01L 25/0657; H01L 24/13; H01L 24/06; H01L 24/81; H01L 2224/48465; H01L 2224/73204; H01L 27/14636; H01L 2224/13022; H01L 2225/06513; H01L 2224/12105; H10W 70/685; H10W 74/114; H10W 90/00; H10W 99/00; H10W 72/0198; H10W 70/611; H10W 72/952; H10W 90/794; H10W 90/724; H10W 90/297; H10W 90/722; H10W 90/701; H10W 90/792; H10W 74/15; H10W 74/00; H10W 70/60; H10W 90/734; H10W 90/401; H10W 70/09; H10W 90/754; H10W 80/327; H10W 80/00; H10W 72/9413; H10W 72/30; H10W 72/877; H10W 72/942; H10W 20/023; H10W 70/05; H10W 20/42; H10W 74/121; H10W 20/40; H10W 72/941; H10W 90/736; H10W 72/347; H10W 74/016; H10W 72/354; H10W 90/26; H10W 90/22; H10W 40/778; H10W 80/701; H10W 80/301; H10W 74/147; H10W 72/9223; H10W 80/334; H10W 44/209; H10W 90/732; H10W 74/142
See application file for complete search history.

(56) References Cited

U.S. PATENT DOCUMENTS

| | | | | |
|---|---|---|---|---|
| 9,177,832 | B2 | 11/2015 | Camacho | |
| 9,391,143 | B2 | 7/2016 | Tong et al. | |
| 9,691,702 | B2 | 6/2017 | Uzoh et al. | |
| 9,728,527 | B2 | 8/2017 | Uzoh et al. | |
| 9,780,042 | B2 | 10/2017 | Woychik et al. | |
| 10,529,693 | B2 | 1/2020 | Agarwal et al. | |
| 10,546,834 | B2 | 1/2020 | Wang et al. | |
| 12,322,718 | B2 * | 6/2025 | Haba | H10W 70/611 |
| 2004/0178495 | A1 | 9/2004 | Yean et al. | |
| 2007/0241440 | A1 | 10/2007 | Hoang et al. | |
| 2008/0142990 | A1 * | 6/2008 | Yu | H10D 84/038 438/109 |
| 2009/0001606 | A1 | 1/2009 | Tamadate | |
| 2009/0102038 | A1 | 4/2009 | Mcelrea et al. | |
| 2010/0140759 | A1 | 6/2010 | Pagaila et al. | |
| 2011/0140283 | A1 | 6/2011 | Chandra et al. | |
| 2011/0304349 | A1 | 12/2011 | Stillman et al. | |
| 2011/0316572 | A1 | 12/2011 | Rahman | |
| 2013/0032390 | A1 | 2/2013 | Hu et al. | |
| 2013/0241080 | A1 | 9/2013 | Pagaila | |
| 2014/0264910 | A1 | 9/2014 | Razdan et al. | |
| 2015/0048503 | A1 | 2/2015 | Chiu et al. | |
| 2015/0126139 | A1 | 5/2015 | Chen et al. | |
| 2015/0235991 | A1 * | 8/2015 | Gu | H05K 1/09 174/262 |
| 2015/0303173 | A1 | 10/2015 | Maydar et al. | |
| 2015/0325550 | A1 | 11/2015 | Zhao | |
| 2016/0071818 | A1 | 3/2016 | Wang et al. | |
| 2016/0379967 | A1 | 12/2016 | Gamini | |
| 2017/0053897 | A1 | 2/2017 | Lai et al. | |
| 2018/0040548 | A1 | 2/2018 | Kim et al. | |
| 2018/0158749 | A1 | 6/2018 | Yu et al. | |
| 2018/0294241 | A1 * | 10/2018 | Chen | H10P 72/74 |
| 2019/0131256 | A1 | 5/2019 | Liao et al. | |
| 2019/0139851 | A1 | 5/2019 | Myung et al. | |
| 2019/0181107 | A1 | 6/2019 | DeLaCruz et al. | |
| 2020/0006254 | A1 | 1/2020 | Chen et al. | |
| 2020/0118973 | A1 | 4/2020 | Wang et al. | |
| 2020/0135594 | A1 * | 4/2020 | Lee | G01R 31/2884 |
| 2020/0176384 | A1 | 6/2020 | Wu et al. | |
| 2020/0350254 | A1 | 11/2020 | Huang | |
| 2021/0098422 | A1 | 4/2021 | Elsherbini et al. | |
| 2021/0202389 | A1 | 7/2021 | Hsieh et al. | |
| 2022/0189861 | A1 | 6/2022 | Aleksov et al. | |
| 2022/0375902 | A1 | 11/2022 | Fay et al. | |
| 2023/0207522 | A1 | 6/2023 | Karhade et al. | |
| 2023/0343769 | A1 | 10/2023 | Karhade et al. | |
| 2024/0047338 | A1 | 2/2024 | Chen et al. | |
| 2024/0105704 | A1 | 3/2024 | Zhong et al. | |
| 2025/0309125 | A1 | 10/2025 | Haba et al. | |
| 2026/0052950 | A1 | 2/2026 | Katkar | |
| 2026/0144168 | A1 | 5/2026 | Gao | |
| 2026/0206546 | A1 | 7/2026 | Variot | |

FOREIGN PATENT DOCUMENTS

| | | | |
|---|---|---|---|
| EP | 4716448 | | 3/2026 |
| JP | 2018-182260 | A | 11/2018 |
| JP | 2020-520562 | A | 7/2020 |
| KR | 2014-0124340 | | 10/2014 |
| KR | 20170019298 | A | 2/2017 |
| KR | 10-2019-0036266 | A | 4/2019 |
| KR | 10-2019-0050620 | A | 5/2019 |
| KR | 10-2020-0002629 | A | 1/2020 |
| KR | 20200028315 | A | 3/2020 |
| KR | 2022-0118006 | A | 8/2022 |
| WO | WO 2017/087899 | A1 | 5/2017 |
| WO | WO 2017/200717 | A1 | 11/2017 |

OTHER PUBLICATIONS

Dillinger, T., “Intel’s EMIB Packaging Technology—A Deep Dive”. SemiWiki—Open Forum for Semiconductor Professionals; May 3, 2021; 8 pages.

Kao et al., “Large-size multi-layered fan-out RDL multi-chip module packaging”. Chip Scale Review Mar. 2022/Apr.; 17-25.

Enquist; Direct Bond Interconnect for Advanced Packaging Applications; 2007; TFUG Proceedings; website: https://nccavs-usergroups.avs.org/proceedings_tfug/ (Year: 2007).

European Extended Search Report dated Aug. 21, 2024, issued in EP Application No. 21864898.8, 9 pages.

European Exam Report dated Mar. 6, 2026, issued in EP Application No. 21864898.8, 10 pages.

European Extended Search Report, dated Apr. 22, 2026, issued in EP Application No. 25227262.0, 12 pages.

* cited by examiner

BONDED STRUCTURE WITH INTERCONNECT STRUCTURE

INCORPORATION BY REFERENCE TO ANY PRIORITY APPLICATIONS

Any and all applications for which a foreign or domestic priority claim is identified in the Application Data Sheet as filed with the present application are hereby incorporated by reference under 37 CFR 1.57. This application is a continuation of U.S. patent application Ser. No. 18/451,388, filed Aug. 17, 2023, and entitled "BONDED STRUCTURE WITH INTERCONNECT STRUCTURE," which is a continuation of U.S. patent application Ser. No. 17/171,531, filed Feb. 9, 2021, and entitled "BONDED STRUCTURE WITH INTERCONNECT STRUCTURE," which claims priority benefit of U.S. Provisional Application No. 63/074,928, filed Sep. 4, 2020, the entire contents of each of which are incorporated herein by reference.

BACKGROUND

Field

The field generally relates to bonded structures, and in particular, to bonded structures with an interconnect structure.

Description of the Related Art

A bonded structure can include an electronic component that is mounted to a carrier or a substrate. The bonded structure can include molding material disposed over the electronic component to provide further mechanical support and/or protection for the bonded structure. During manufacturing (and/or operation) of the bonded structure, heat may be applied to the bonded structure. The application of heat (e.g., an annealing process) may impart stresses to the electronic component. Accordingly, there remains a continuing need for improved structures and methods for manufacturing a bonded structure.

BRIEF DESCRIPTION OF THE DRAWINGS

Specific implementations will now be described with reference to the following drawings, which are provided by way of example, and not limitation.

DETAILED DESCRIPTION OF THE PREFERRED EMBODIMENT

Figure 1A:
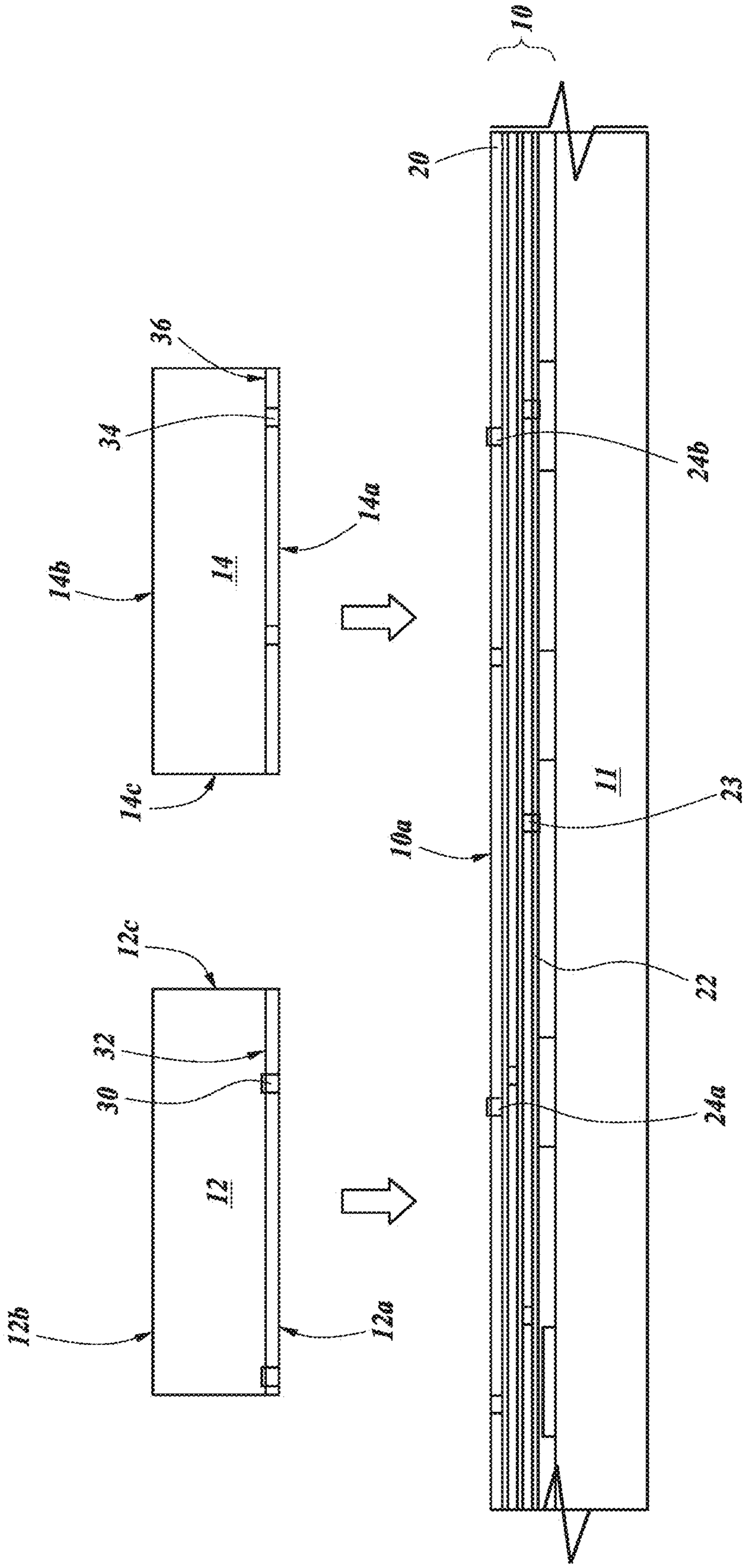
FIG. 1A shows a step in forming a bonded structure.

FIGS. 1A-1D illustrate a manufacturing process for forming a bonded structure 1, according to various embodiments.

The resulting bonded structure 1 (see FIG. 1D) can include an electronic component (e.g., an integrated device die) mounted on an interconnect structure 10. For example, a first integrated device die 12 and a second integrated device die 14 can be mounted on the interconnect structure 10. The interconnect structure 10 (e.g., a redistribution layer (RDL)) can route input/output (IO) pads of the electrical component (the first integrated device die 12 and/or the second integrated device die 14) to another location in the bonded structure 1. For example, in some embodiments, the interconnect structure 10 can comprise a fan-out structure in which signals from relatively fine-pitch contact pads of the electrical component are routed out to pads outside the footprint of the component. In some applications, the interconnect structure 10 can allow an electrical communication between two or more dies (e.g., the first integrated device die 12 and the second integrated device die 14) mounted to the interconnect structure 10. A molding material 16 or encapsulant can be provided between the two or more dies (the first integrated device die 12 and the second integrated device die 14) for mechanical support and/or protection. During manufacturing (and/or operation) of the bonded structure 1, the materials may be heated, which can create reliability problems and/or defects due to mismatch of thermal coefficients of expansion. For example, during manufacturing (and/or operation) of the bonded structure 1, heating of the bonded structure can impart stresses near an interface (e.g., an edge) between the integrated device die (the first integrated device die 12 or the second integrated device die 14), the interconnect structure 10, and the molding material 16. In some embodiments, a width of the molding material is less than about 20% of a width of the first integrated die 12 or the second integrate die 14, and preferably less than about 10% of a width of the said dies. For example, the width of the molding material is between 3% to 20%, 5% to 20%, 3% to 10%, or 5% to 10% of the width of the first integrated device die 12 or the second integrated device die 14.

Various embodiments disclosure herein relate to bonded structures having improved reliability when heated, for example, during manufacturing and/or bonding. A bonded structure can include a interconnect structure (e.g., an RDL), a first die bonded to the interconnect structure, a second die bonded to the interconnect structure, and a low coefficient of thermal expansion (CTE) layer disposed between the first die and the second die. The bonded structure can also include a molding material that is disposed between the first die and the second die. The first die and/or the second die can be directly bonded to the interconnect structure without an intervening adhesive.

Two or more semiconductor elements (such as integrated device dies, wafers, etc.) may be stacked on or bonded to one another to form a bonded structure. Conductive contact pads of one element may be electrically connected to corresponding conductive contact pads of another element. Any suitable number of elements can be stacked in the bonded structure.

In some embodiments, the elements (e.g., the first integrated device die 12 and the interconnect structure 10) are directly bonded to one another without an adhesive. In various embodiments, a dielectric field region (e.g., a non-conductive material 32) (also referred to as a nonconductive bonding region) of a first element (e.g., a first semiconductor device die with active circuitry or the first integrated device die 12) can be directly bonded (e.g., using dielectric-to-dielectric bonding techniques) to a corresponding dielectric field region (e.g., a non-conductive material 20) of a second element (e.g., a second semiconductor device die with active circuitry or the interconnect structure 10) without an adhesive. For example, dielectric-to-dielectric bonds may be formed without an adhesive using the direct bonding techniques disclosed at least in U.S. Pat. Nos. 9,564,414; 9,391,143; and 10,434,749, the entire contents of each of which are incorporated by reference herein in their entirety and for all purposes.

In various embodiments, hybrid direct bonds can be formed without an intervening adhesive. For example, dielectric bonding surfaces can be polished to a high degree of smoothness. The bonding surfaces can be cleaned and exposed to a plasma and/or etchants to activate the surfaces. In some embodiments, the surfaces can be terminated with a species after activation or during activation (e.g., during the plasma and/or etch processes). Without being limited by theory, in some embodiments, the activation process can be performed to break chemical bonds at the bonding surface, and the termination process can provide additional chemical species at the bonding surface that improves the bonding energy during direct bonding. In some embodiments, the activation and termination are provided in the same step, e.g., a plasma or wet etchant to activate and terminate the surfaces. In other embodiments, the bonding surface can be terminated in a separate treatment to provide the additional species for direct bonding. In various embodiments, the terminating species can comprise nitrogen. Further, in some embodiments, the bonding surfaces can be exposed to fluorine. For example, there may be one or multiple fluorine peaks near layer and/or bonding interfaces. Thus, in the directly bonded structures, the bonding interface between two dielectric materials can comprise a very smooth interface with higher nitrogen content and/or fluorine peaks at the bonding interface. Additional examples of activation and/or termination treatments may be found throughout U.S. Pat. Nos. 9,564,414; 9,391,143; and 10,434,749, the entire contents of each of which are incorporated by reference herein in their entirety and for all purposes.

In various embodiments, conductive contact pads of the first element can be directly bonded to corresponding conductive contact pads of the second element. For example, a hybrid bonding technique can be used to provide conductor-to-conductor direct bonds along a bond interface that includes covalently direct bonded dielectric-to-dielectric surfaces, prepared as described above. In various embodiments, the conductor-to-conductor (e.g., contact pad to contact pad) direct bonds and the dielectric-to-dielectric hybrid bonds can be formed using the direct bonding techniques disclosed at least in U.S. Pat. Nos. 9,716,033 and 9,852,988, the entire contents of each of which are incorporated by reference herein in their entirety and for all purposes.

For example, dielectric bonding surfaces can be prepared and directly bonded to one another without an intervening adhesive as explained above. Conductive contact pads (which may be surrounded by nonconductive dielectric field regions) may also directly bond to one another without an intervening adhesive. In some embodiments, the respective contact pads can be recessed below exterior (e.g., upper) surfaces of the dielectric field or nonconductive bonding regions, for example, recessed by less than 20 nm, less than 15 nm, or less than 10 nm, for example, recessed in a range of 2 nm to 20 nm, or in a range of 4 nm to 10 nm. The nonconductive bonding regions can be directly bonded to one another without an adhesive at room temperature in some embodiments and, subsequently, the bonded structure can be annealed. Upon annealing, the contact pads can expand and contact one another to form a metal-to-metal direct bond. Beneficially, the use of Direct Bond Interconnect, or DBI®, techniques can enable high density of pads connected across the direct bond interface (e.g., small or fine pitches for regular arrays). In some embodiments, the pitch of the bonding pads may be less 40 microns or less than 10 microns or even less than 2 microns. For some applications the ratio of the pitch of the bonding pads to one of the dimensions of the bonding pad is less than 5, or less than 3 and sometimes desirably less than 2. In various embodiments, the contact pads can comprise copper, although other metals may be suitable.

Thus, in direct bonding processes, a first element can be directly bonded to a second element without an intervening adhesive. In some arrangements, the first element can comprise a singulated element, such as a singulated integrated device die. In other arrangements, the first element can comprise a carrier or substrate (e.g., a wafer) that includes a plurality (e.g., tens, hundreds, or more) of device regions that, when singulated, form a plurality of integrated device dies. Similarly, the second element can comprise a singulated element, such as a singulated integrated device die. In other arrangements, the second element can comprise a carrier or substrate (e.g., a wafer).

As explained herein, the first and second elements can be directly bonded to one another without an adhesive, which is different from a deposition process. The first and second elements can accordingly comprise non-deposited elements. Further, directly bonded structures, unlike deposited layers, can include a defect region along the bond interface in which nanovoids are present. The nanovoids may be formed due to activation of the bonding surfaces (e.g., exposure to a plasma). As explained above, the bond interface can include concentration of materials from the activation and/or last chemical treatment processes. For example, in embodiments that utilize a nitrogen plasma for activation, a nitrogen peak can be formed at the bond interface. In embodiments that utilize an oxygen plasma for activation, an oxygen peak can be formed at the bond interface. In some embodiments, the bond interface can comprise silicon oxynitride, silicon oxycarbonitride, or silicon carbonitride. The bonding layers can also comprise polished surfaces that are planarized to a high degree of smoothness.

In various embodiments, the metal-to-metal bonds between the contact pads can be joined such that copper grains grow into each other across the bond interface. In some embodiments, the copper can have grains oriented along the 111 crystal plane for improved copper diffusion across the bond interface. The bond interface can extend substantially entirely to at least a portion of the bonded contact pads, such that there is substantially no gap between the nonconductive bonding regions at or near the bonded contact pads. In some embodiments, a barrier layer may be provided under the contact pads (e.g., which may include copper). In other embodiments, however, there may be no barrier layer under the contact pads, for example, as described in US 2019/0096741, which is incorporated by reference herein in its entirety and for all purposes.

FIG. 1A shows a step in forming a bonded structure 1. In FIG. 1A, an interconnect structure 10 is formed on a carrier 11. The carrier 11 can comprise a wafer in various embodiments. The step in FIG. 1A shows a first integrated device die 12 and a second integrated device die 14 prior to be mounted to the interconnect structure 10. The dies 12, 14 can comprise any suitable type of device die, such as a processor die, a memory die, a sensor die, etc. The dielectric field region (e.g., a non-conductive material 32) can be provided over a bulk semiconductor region (e.g., silicon) of the dies 12, 14.

Figure 1B:
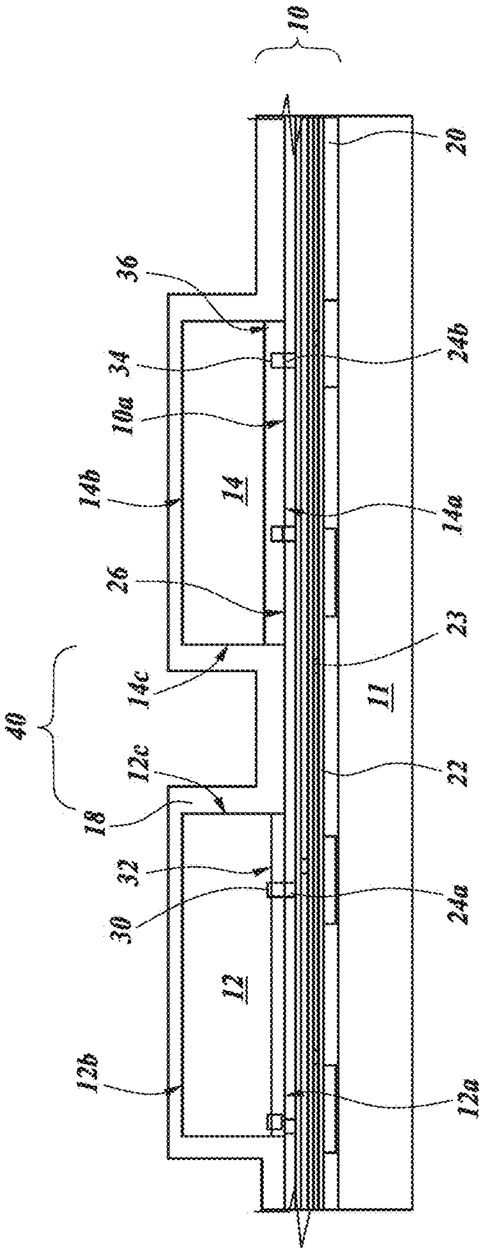
FIG. 1B shows another step in forming the bonded structure.

FIG. 1B shows another step in forming the bonded structure 1. The first integrated device die 12 and the second integrated device die 14 are mounted (e.g., directly bonded without an intervening adhesive) to the interconnect structure 10. Also, in FIG. 1B, a low coefficient of thermal expansion (CTE) dielectric layer 18 is provided. As shown, the dielectric layer 18 can be deposited over upper surfaces of the dies 12, 14, and over the interconnect structure 10 in a space between the dies 12, 14. In some embodiment, the dielectric layer 18 can comprise a conformal coating. In some embodiments, the CTE of dielectric layer 18 may be less than 10 ppm/° C. and less than 6 ppm/° C. and preferably less than 2 ppm/° C. For example, the CTE of dielectric layer 18 may be in a range of 1 ppm/° C. to 10 ppm/° C., in a range of 2 ppm/° C. to 6 ppm/° C., or in a range of 1 ppm/° C. to 2 ppm/° C. The dielectric layer 18 may comprise multiple dielectric layers. Each dielectric layer of the multiple dielectric layer can comprise different CTE. In some embodiments, the thickness of the dielectric layer 18 can be thinner than the thickness of the integrated device die 12, 14. For example, the thickness of the dielectric layer 18 can be less than 50% of the thickness of the integrated device die 12, 14, or the thickness of the dielectric layer 18 can be less than 20% of the thickness of die 12 or 14.

Figure 1C:
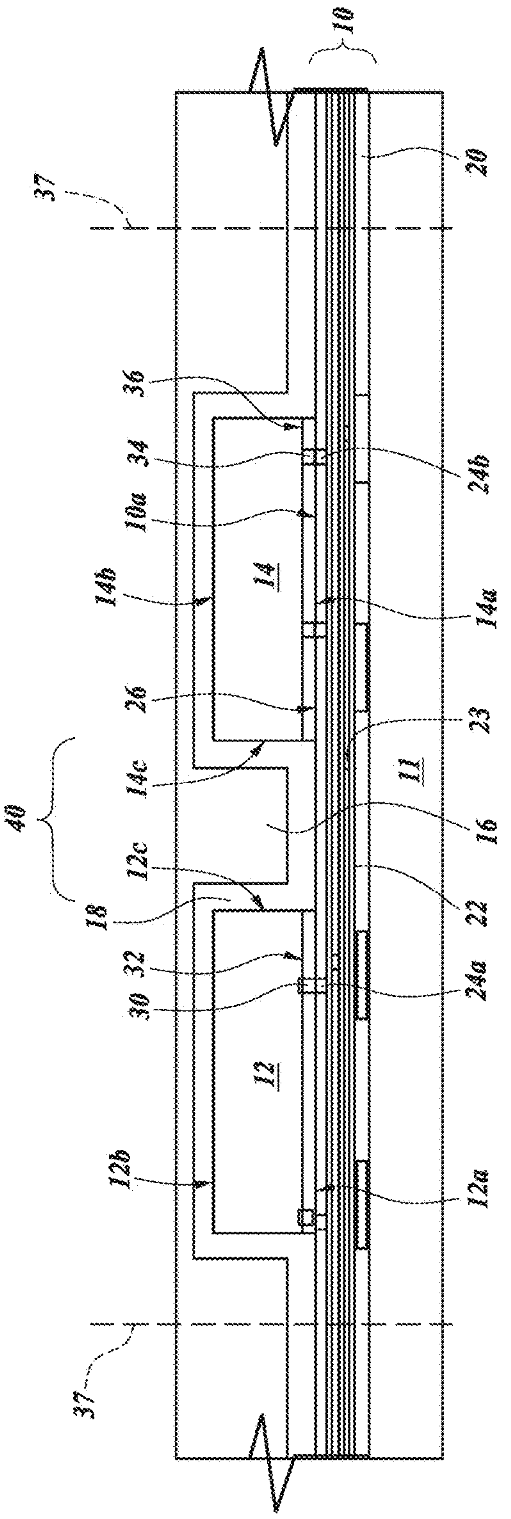
FIG. 1C shows another step in forming the bonded structure.
Figure 1D:
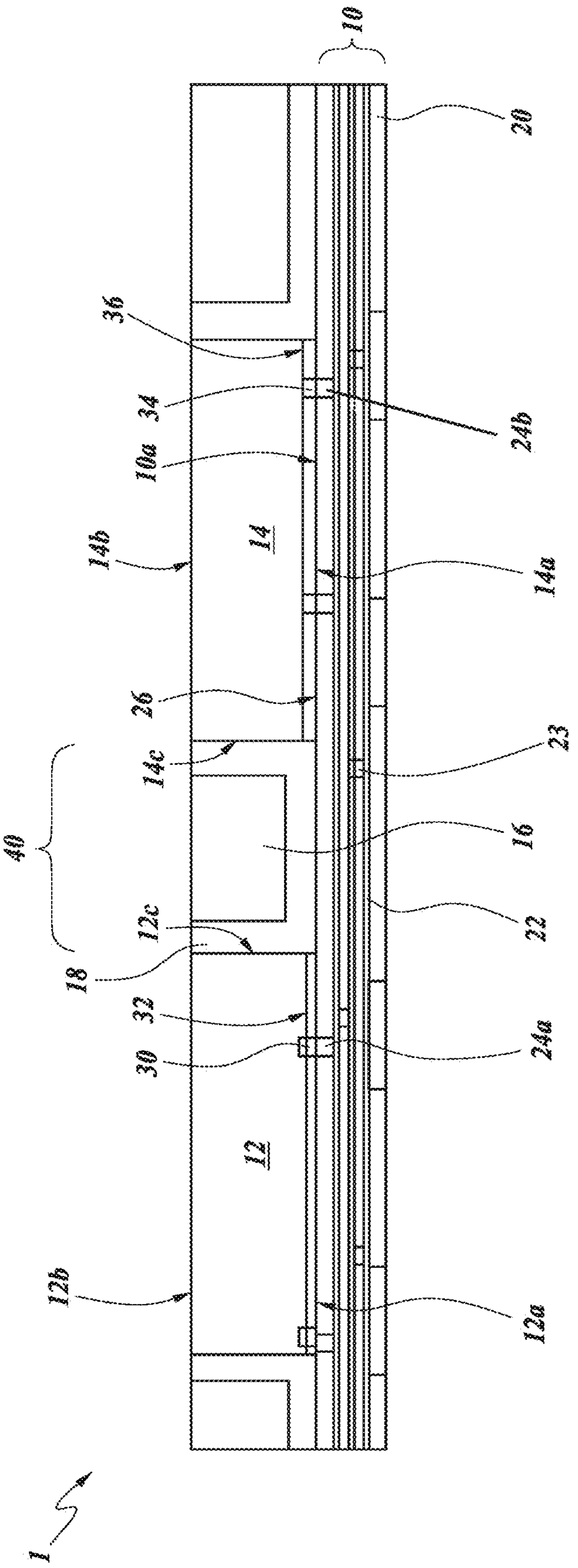
FIG. 1D is a schematic cross sectional side view of the bonded structure according to an embodiment.

FIG. 1C shows another step in forming the bonded structure 1. At the step in FIG. 1C, a molding material 16 is provided over the dielectric layer 18, including at locations overlying the dies 12, 14 and in the space between the dies 12, 14. The structure 1 shown in FIG. 1C can comprise a reconstituted wafer comprises a plurality of dies 12, 14 mounted to the carrier 11 and at least partially encapsulated with the molding material 16. At least a portion of the CTE dielectric layer 18 over the first integrated device die 12 and/or the second integrated device die can be removed or thinned (e.g., etched or grinded). At least a portion of the molding material 16 over the first integrated device die 12 and/or the second integrated device die can be removed or thinned (e.g., etched or grinded). The structure shown in FIG. 1C can be singulated at the singulation lines 37 to define the bonded structure 1 as shown in FIG. 1D. In some embodiments, the singulation lines 37 can comprise saw streets. The side edges of the bonded structure 1 can comprise a signature indicative of the singulation process, such as saw marking, etch lines, etc.

In some embodiments, the carrier 11 can remain with the interconnect structure until after the application of the molding material 16. However, in some other processes, the carrier 11 can be removed from the interconnect structure 10 at any suitable time, for example, before application of the molding material 16, or before application of the dielectric layer 18. For example, the carrier can be removed from the interconnect structure after the step shown in FIG. 1A and before the step shown in FIG. 1B, after the step shown in FIG. 1B and before the step shown in FIG. 1C, or after the step shown in FIG. 1C and before the step shown in FIG. 1D. In the illustrated embodiment, the carrier 11 is removed after the step shown in FIG. 1C, e.g., after partial removal of the molding material 16 and dielectric layer 18. In some embodiments, the carrier 11 may comprise an optically transparent carrier or plate. The optically transparent carrier may be mechanically coupled to the lower surface of the interconnect structure 10 with for example UV light releasable layer (not shown).

FIG. 1D shows a schematic cross sectional side view of the bonded structure 1 according to an embodiment. In some embodiments, the bonded structure 1 can comprise a singulated reconstituted element that has been singulated from a reconstituted wafer. The bonded structure can comprise an interconnect structure 10, a first integrated device die 12 mounted to the interconnect structure 10, and a second integrated device die 14 mounted to the interconnect structure 10. The interconnect structure 10 can be provided by way of a transfer process. For example, in some embodiments, the interconnect structure 10 (e.g., RDL) can be formed on a carrier (such as a semiconductor or glass carrier) and directly bonded to the dies 12, 14. The carrier can be removed from the interconnect structure 10 to transfer the RDL to the dies 12, 14. Therefore, in some embodiments, the interconnect structure 10 can comprise a transfer RDL. The first and second dies 12, 14 can be spaced apart from one another along the interconnect structure 10. For example, the first and second dies 12, 14 can be aligned to the design of the interconnect structure. The bonded structure 1 can also include a molding material 16 disposed between the first die 12 and the second die 14, and a low coefficient of thermal expansion (CTE) dielectric layer 18. Although there are only two dies 12, 14 illustrated in FIG. 1, the bonded structure 1 can comprise three or more dies, in other embodiments.

In some embodiments, the interconnect structure 10 can comprise a redistribution layer (RDL). In some embodiments, the interconnect structure 10 can serve as an alignment layer by locking and aligning the relative lateral positions of the dies 12, 14 relative to one another. The interconnect structure 10 can comprise a non-conductive material 20, a plurality of conductive lines 22 formed in the non-conductive material 20, a plurality of conductive vias 23 formed in the non-conductive material 20. In some embodiments, a conductive via 23 can extend through a thickness of the non-conductive material 20. The non-conductive material 20 can comprise any suitable material. For example, the non-conductive material 20 can comprise a dielectric material, such as an oxide material (e.g., silicon oxide), a nitride material (e.g., silicon nitride), or amorphous silicon. In some embodiments, the interconnect structure 10 can have an upper contact surface 10*a* that comprises a plurality of conductive pads (e.g., a first conductive pad 24*a* and a second conductive pad 24*b*), and a non-conductive region 26 at least between the first conductive pad 24*a* and the second conductive pad 24*b*.

The first integrated device die 12 and/or the second integrated device die 14 can comprise any suitable type of device die. For example, the first integrated device die 12 and/or the second integrated device die 14 can comprise an electronic component such as a processor die, a memory die, a microelectromechanical systems (MEMS) die, an optical device, or any other suitable type of device die. In some embodiments, the first integrated device die 12 and/or the second integrated device die 14 can comprise a stack of a plurality of dies. In other embodiments, the electronic component can comprise a passive device such as a capacitor, inductor, or other surface-mounted device. Circuitry (such as active components like transistors) can be patterned at or near active surface(s) of the first integrated device die 12 and/or the second integrated device die 14 in various embodiments. The active surfaces may be on a side of the first integrated device die 12 and/or the second integrated device die 14 which is opposite respective backsides of the dies first integrated device die 12 and/or the second integrated device die 14. The backsides may or may not include any active circuitry or passive devices. The first integrated device die 12 and the second integrated device die 14 may be the same type of integrated device die or a different type of device die.

The first die 12 can comprise a bonding surface 12*a* and an upper surface 12*b* opposite the bonding surface 12*a*. The bonding surface 12*a* can have a conductive bond pad 30, and a non-conductive material 32 proximate to the conductive bond pad 30. In some embodiments, the conductive bond pad 30 can be bonded to the first conductive pad 24*a*, and the non-conductive material 32 can be bonded to a portion of the non-conductive region 26. In some embodiments, the conductive bond pad 30 can be directly bonded to the first conductive pad 24*a* without an intervening adhesive, and the non-conductive material 32 can be directly bonded to the portion of the non-conductive region 26 without an intervening adhesive. The non-conductive materials 32, 36 and conductive bond pads 30, 24 can be directly bonded without an adhesive as described below.

The second die 14 can comprise a bonding surface 14*a* and a back surface 14*b* opposite the bonding surface 14*a*. The bonding surface 14*a* can have a conductive bond pad 34, and a non-conductive material 36 proximate to the conductive bond pad 34. In some embodiments, the conductive bond pad 34 can be bonded to the second conductive pad 24*b*, and the non-conductive material 36 can be bonded to a portion of the non-conductive region 26. In some embodiments, the conductive bond pad 34 can be directly bonded to the second conductive pad 24*b* without an intervening adhesive, and the non-conductive material 36 can be directly bonded to the portion of the non-conductive region 26 without an intervening adhesive.

In some embodiments, the first integrated device die 12 and/or the second integrated device die 14 can be bonded to the interconnect structure 10 such that, the active surface(s) of the first integrated device die 12 and/or the second integrated device die 14 face the interconnect structure 10. In some embodiments, the first integrated device die 12 and/or the second integrated device die 14 can be bonded to the interconnect structure 10 such that, the active surface(s) of the first integrated device die 12 and/or the second integrated device die 14 face away the interconnect structure 10. In some embodiments, the active surface of one of the first integrated device die 12 and the second integrated device die 14 faces the interconnect structure 10 and the active surface of the other one of the first integrated device die 12 and the second integrated device die 14 faces away the interconnect structure 10. In the illustrated embodiment, the dielectric layer 18 and the non-conductive material 32 can be flush with the upper surface of the interconnect structure 10. The non-conductive material 32 can accordingly extend along side surfaces of the bulk portion of the dies 12, 14 and along side surfaces of the non-conductive material 32.

The molding material 16 can comprise a polymer, epoxy, resin, or the like material. In some embodiments, the molding material 16 provide mechanical support for the first integrated device die 12 and/or the second integrated device die 14. In some embodiments, the molding material 16 can at least partially fill a gap 40 between the first integrated device die 12 and the second integrated device die 14. The CTE of the molding material 16 may be relatively high such that the molding material 16 may expand when heated, which can induce stresses in the dies 12, 14 and/or the interconnect structure 10.

The low CTE layer 18 can comprise any suitable material. In some embodiments, the low CTE layer 18 can have a CTE that is equal to or lower than that of the non-conductive material 20 of the interconnect structure 10, the non-conductive material 32 of the first die 12, or the non-conductive material 36 of the second die 14. In some embodiments, the low CTE layer 18 can have a CTE that is lower than that of the molding material 16. In some embodiments, the low CTE layer 18 can comprise a dielectric layer. For example, the low CTE layer 18 can comprise a silicon oxide layer. The use of a low CTE layer 18 can reduce the overall thermal mismatch between the molding material 16 and the other components of the structure. The layer 18 can comprise a material that is different from or the same as non-conductive material 32. The layer 18 can be a different material from the molding material 16. The low CTE layer 18 can beneficially reduce and/or remove stresses at the first die 12, the interconnect structure 10, and the molding material 16 during manufacture (or operation) relative to a similar bonded structure without a low CTE layer. In some embodiments, the low CTE layer 18 can have a thickness in a range of, for example, 1 μm to 10 μm, in a range of, for example, 1 μm to 5 μm, in a range of, for example, 3 μm to 10 μm, in a range of, for example, 5 μm to 10 μm, or in a range of, for example, 3 μm to 5 μm.

In some embodiments, the low CTE layer 18 can be disposed along at least a portion of a sidewall 12*c* of the first integrated device die 12. In the illustrated embodiment, the layer 18 may be disposed only along the sidewall 12*c*, e.g., not along the upper surface 12*b* of the integrated device die 12. In some embodiments, a majority of the upper surface 12*b* of the integrated device die 12 can be free from the low CTE layer 18. In some embodiments, the low CTE layer 18 can be disposed along at least a portion of a sidewall 14*c* of the second integrated device die 14. In some embodiments, the low CTE layer 18 can be applied to the upper surface 12*b* and the sidewall 12*c* of the die 12, and the low CTE layer 18 can be removed from the upper surface 12*b* by, for example, lapping. In the illustrated embodiment, the layer 18 may be disposed only along the sidewall 14*c*, e.g., not along the upper surface of the die 14. In some embodiments, the low CTE layer 18 can be disposed along at least a portion of the upper contact surface 10*a* of the interconnect structure 10. In some embodiments, the low CTE layer 18 can comprise a conformal layer that conform with surfaces of the first die 12, second die 14, and the interconnect structure 10. In some embodiments, the low CTE layer 18 can separate the molding material 16 from surfaces of the first die 12, second die 14, and the interconnect structure 10. In some embodiments, the low CTE layer 18 completely separates the molding material 16 from the interconnect structure 10 such that no portion of the molding material directly contacts the interconnect structure 10. In some embodiments, the low CTE layer 18 can have a CTE in a range of, for example, 3 ppm to 7 ppm, in a range of, for example, 3 ppm to 5 ppm, in a rage of, for example, 5 ppm to 7 ppm.

In some embodiments, the low CTE layer 18 can improve rigidity of the bonded structure 1. In some embodiments, the low CTE layer 18 can provide more reliability during manufacture (and/or operation) of the bonded structure 1 than a similar bonded structure without a low CTE layer. A similar bonded structure without the low CTE layer can have a high stress region at a three point corner or edge between its die, interconnect structure, and molding material. In the bonded structure 1, the low CTE layer 18 can move or shift the high stress region from the three point corner to a region near a corner between the CTE layer 18 and the interconnect structure 10 thereby reducing the stress applied to the first die 12 or the second die 14. For example, the low CTE layer 18 can reduce stress applied to the first and second dies 12, 14 during manufacturing (and/or operation) of the bonded structure.

Bonding surfaces (e.g., the upper contact surface 10*a*, the bonding surface 12*a*, and the bonding surface 14*a*) can be polished or planarized, activated, and terminated with a suitable species. For example, in various embodiments, one or more of the non-conductive region 26, the non-conductive material 32 at the bonding surface 12*a*, and the conductive bond pad 34 (e.g., non-conductive material) at the bonding surface 14*a* may comprise an inorganic dielectric material, for example, silicon oxide. The bonding surfaces can be polished to a root-mean-square (rms) surface roughness of less than 2 nm, e.g., less than 1 nm, less than 0.5 nm, etc. The polished bonding surfaces can be activated by for example, a process comprising atmospheric or a vacuum plasma method. In various embodiments, the bonding surfaces can be terminated with nitrogen, for example, by way of wet or dry etching (e.g., very slight etching (VSE)) using, for example, a nitrogen-containing solution or by using a plasma etch with nitrogen. In some embodiments, a portion of the non-conductive region 26 and the non-conductive material 32 at the bonding surface 12*a* can be brought into contact to form a direct bond at room temperature without application of external pressure and without an adhesive. In some embodiments, a non-conductive region 26 and the conductive bond pad 34 at the bonding surface 14*a* can be brought into contact to form a direct bond at room temperature without application of external pressure and without an adhesive.

In some embodiments, the bonded structure 1 can be heated further to improve the bond strength between the opposing bonding surfaces of the interconnect structure 10 and the first die 12 and/or the second die 14, and to form reliable electrical and mechanical contact at the interface between the interconnect structure 10 and the first die 12 or the second die 14. For example, in some embodiments, the respective contact pads 24*a*, 24*b*, and conductive bond pads 30, 34 can be flush with the surface of the respective non-conductive region 26 and non-conductive materials 32, 36, or can be recessed below the non-conductive region 26 and non-conductive materials 32, 36, for example, recessed in a range of 0 nm to 20 nm, or in a range of 4 nm to 10 nm. Portions of the non-conductive region 26 and the non-conductive materials 32, 36 can be directly bonded to one another without an adhesive at room temperature and, subsequently, the bonded structure 1 can be annealed. Upon annealing, the contact pads 24*a*, 24*b*, and conductive bond pads 30, 34 can expand and contact one another to form a metal-to-metal direct bond. The metal-to-metal direct bonds can provide an electrical and a mechanical connection between the opposing bonding surfaces of the interconnect structure 10 and the first die 12 and/or the second die 14. Additional details of the direct bonding processes used in conjunction with each of the disclosed embodiments may be found throughout U.S. Pat. Nos. 7,126,212; 8,153,505; 7,622,324; 7,602,070; 8,163,373; 8,389,378; 7,485,968; 8,735,219; 9,385,024; 9,391,143; 9,431,368; 9,953,941; 9,716,033; 9,852,988; 10,032,068; 10,204,893; 10,434,749; and 10,446,532, the contents of each of which are hereby incorporated by reference herein in their entirety and for all purposes.

Figure 1E:
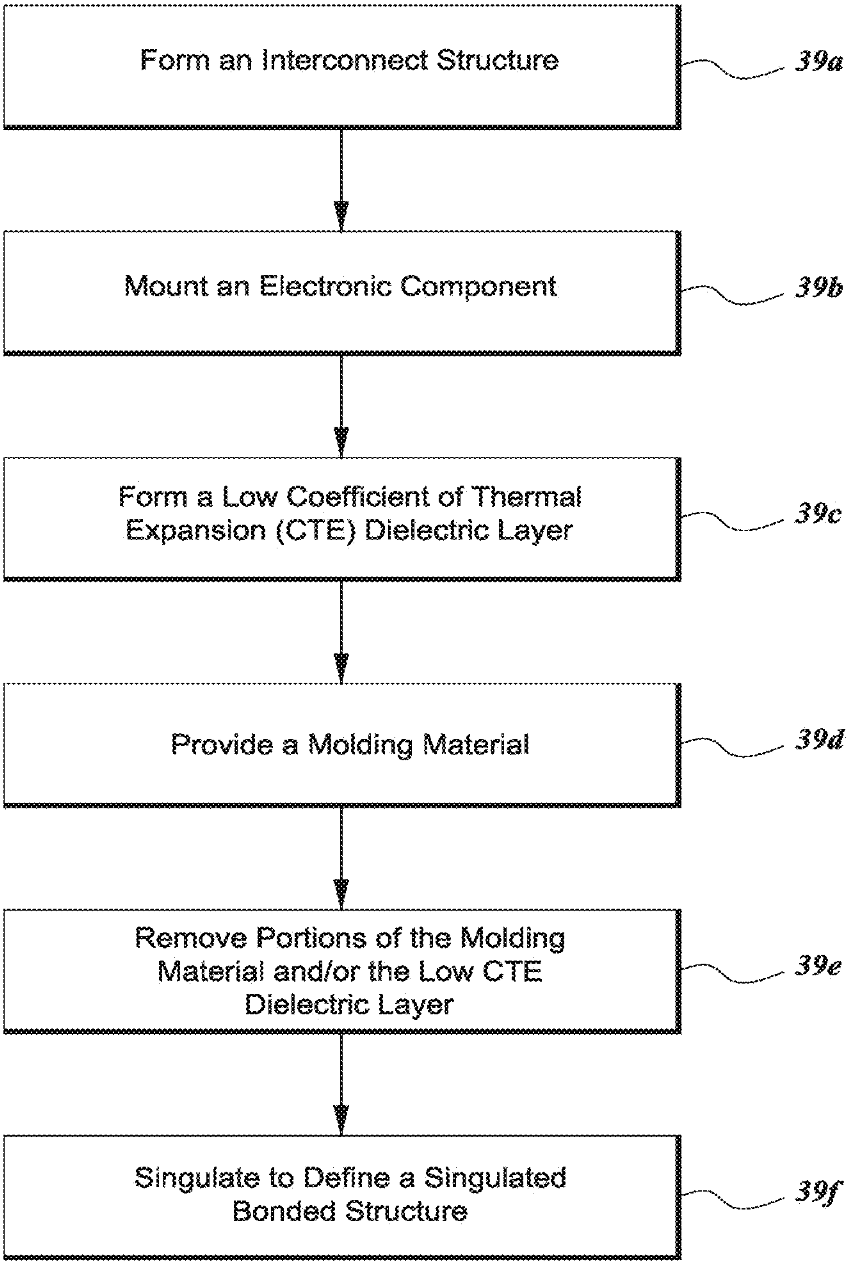
FIG. 1E is a flow chart showing steps for forming a bonded structure according to an embodiment.

FIG. 1E is a flow chart showing steps for forming a bonded structure according to an embodiment. At a step 39*a* (also see FIG. 1A), an interconnect structure 10 can be formed and provided. The interconnect structure 10 can be provided by way of a transfer process. For example, in some embodiments, the interconnect structure 10 (e.g., an RDL) can be formed on a carrier 11 (such as a semiconductor or glass carrier). At a step 39*b* (also see FIG. 1B), an electronic component (e.g., an integrated device die 12, 14) can be mounted to the interconnect structure 10. At a step 39*c* (also see FIG. 1B), a low coefficient of thermal expansion (CTE) dielectric layer 18 can be provided. In some embodiments the low CTE dielectric layer 18 can comprise an inorganic dielectric material, such as a silicon oxide layer. In some embodiments, the low CTE dielectric layer 18 can be provided by way of deposition. At a step 39*d* (also see FIG. 1C), a molding material 16 can be provided. In some embodiments, the molding material 16 can comprise a polymer, epoxy, resin, liquid crystal polymer or the like material. The low CTE dielectric layer 18 can comprise a material that has a CTE that is lower than a CTE of the molding material 16. At a step 39*e*, at least a portion of the CTE dielectric layer 18 over electronic component can be removed or thinned (e.g., etched or grinded). At the step 39*c*, at least a portion of the molding material 16 over the electronic component can be removed or thinned (e.g., etched or grinded). At a step 39*f* (also see FIGS. 1C and 1D), the resulting structure can be singulated to define the singulated bonded structure 1. As described above, in some embodiments, a width of the molding material is less than 20% of a width of the first integrated die 12 or the second integrate die 14, and preferably less than 10% of a width of the said dies.

The carrier 11 can be removed from the interconnect structure 10 to transfer the RDL to the electronic component (e.g., the first integrated device die 12) at any suitable time in the manufacturing process. For example, the carrier 11 can be removed from the interconnect structure 10 after the step 39*a* and before the step 39*b*, after the step 39*b* and before the step 39*c*, after the step 39*c* and before the step 39*d*, after the step 39*d* and before the step 39*e*, after the step 39*e* and before the step 39*f*, or after the step 39*f*.

Figure 2:
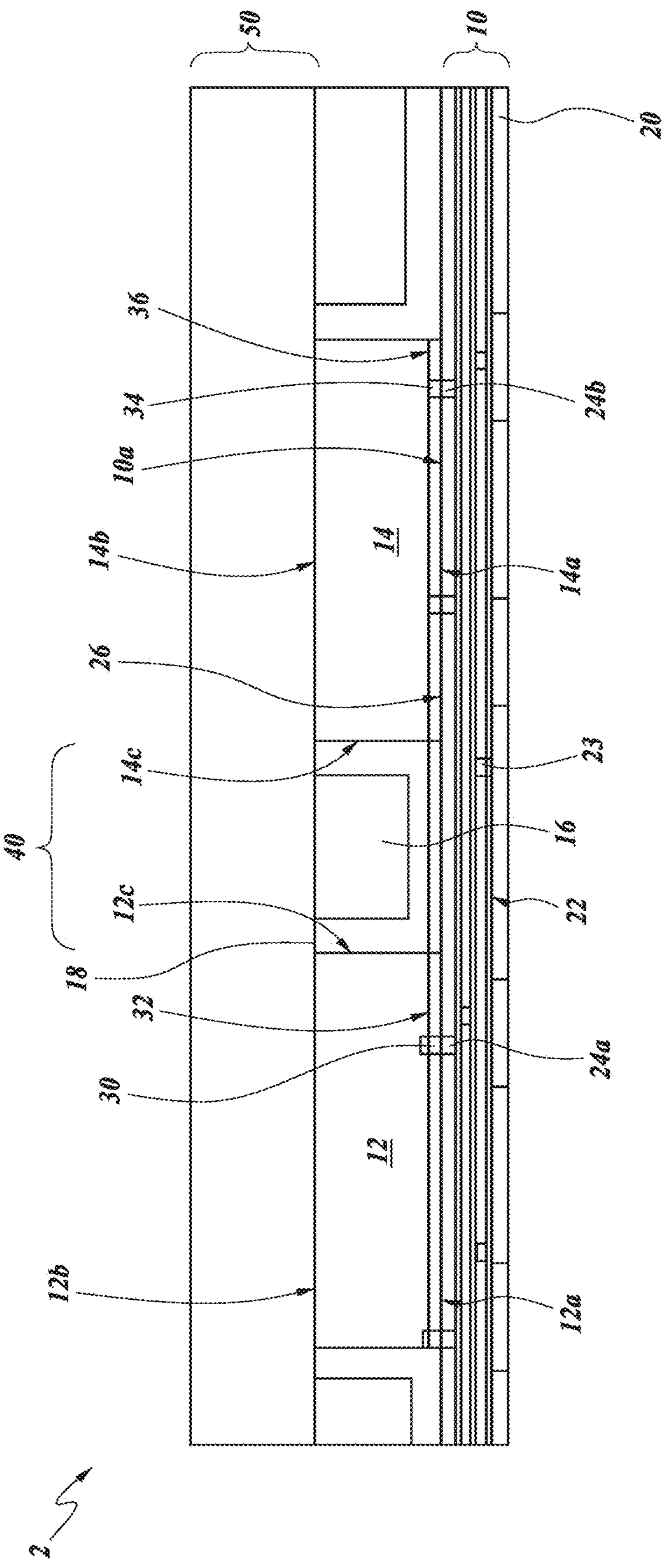
FIG. 2 is a schematic cross sectional side view of a bonded structure according to another embodiment.

FIG. 2 shows a schematic cross sectional side view of a bonded structure 2 according to an embodiment. Unless otherwise noted, the components of FIG. 2 may be the same as or generally similar to like-numbered components of FIG. 1. The bonded structure can comprise an interconnect structure 10, a first integrated device die 12 mounted to the interconnect structure 10, and a second integrated device die 14 mounted to the interconnect structure 10. The bonded structure 2 can also include a molding material 16 disposed between the first die 12 and the second die 14, and a low coefficient of thermal expansion (CTE) layer 18. The bonded structure 2 can further include a support structure 50.

The support structure 50 can comprise any suitable material for supporting the first integrated device die 12 and/or the second integrated device die 14, such as a silicon handle wafer or other structure. The support structure 50 can be positioned such that the first integrated device die 12 and the second integrated device die 14 are positioned between the support structure 50 and the interconnect structure 10.

In some embodiments, the support structure 50 can comprise a third integrated device die. In such embodiments, the support structure may provide an electrical connection between the first integrated device die 12 and the second integrated device die 14. Also, the third integrated device die can electrically connect to the interconnect structure 10 by way of a via (not illustrated) formed in the first integrated device die 12, the second integrated deice die 14, or the molding material 16.

Figure 3:
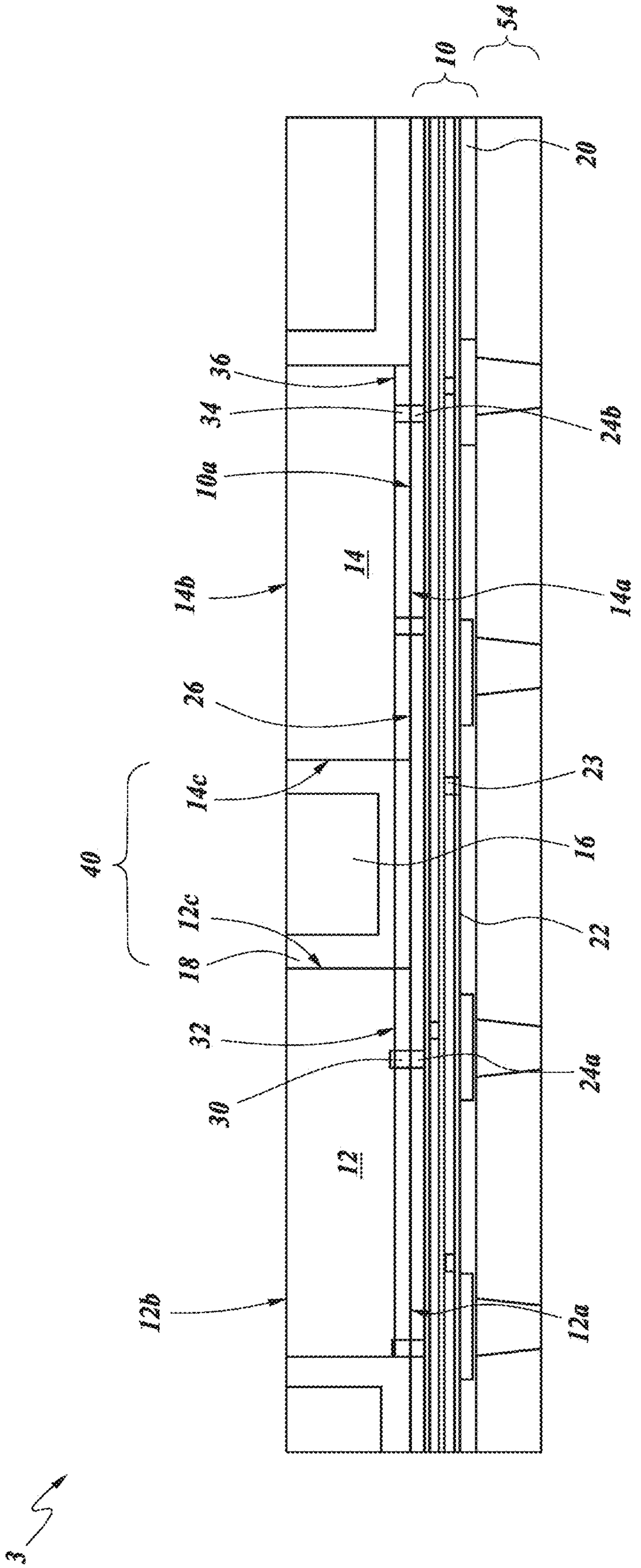
FIG. 3 is a schematic cross sectional side view of a bonded structure according to another embodiment.

FIG. 3 shows a schematic cross sectional side view of a bonded structure 3 according to an embodiment. Unless otherwise noted, the components of FIG. 3 may be the same as or generally similar to like-numbered components of FIGS. 1A-2. The bonded structure can comprise an interconnect structure 10, a first integrated device die 12 mounted to the interconnect structure 10, and a second integrated device die 14 mounted to the interconnect structure 10. The support structure 50 can be removed from the structure of FIG. 2 to form the structure 3 of FIG. 3. The bonded structure 2 can also include a molding material 16 disposed between the first die 12 and the second die 14, and a low coefficient of thermal expansion (CTE) layer 18. The bonded structure 2 can further include a substrate 54.

The substrate 54 can comprise a conductive via 56 the extends at least partially through the substrate. In some embodiments, the via 56 can be electrically coupled with the first integrated deice die 12 and/or the second integrated device die 14 through the interconnect structure 10. The substrate 54 can comprise any suitable material. In some embodiments, the substrate 54 can comprise a semiconductor die.

Figure 4:
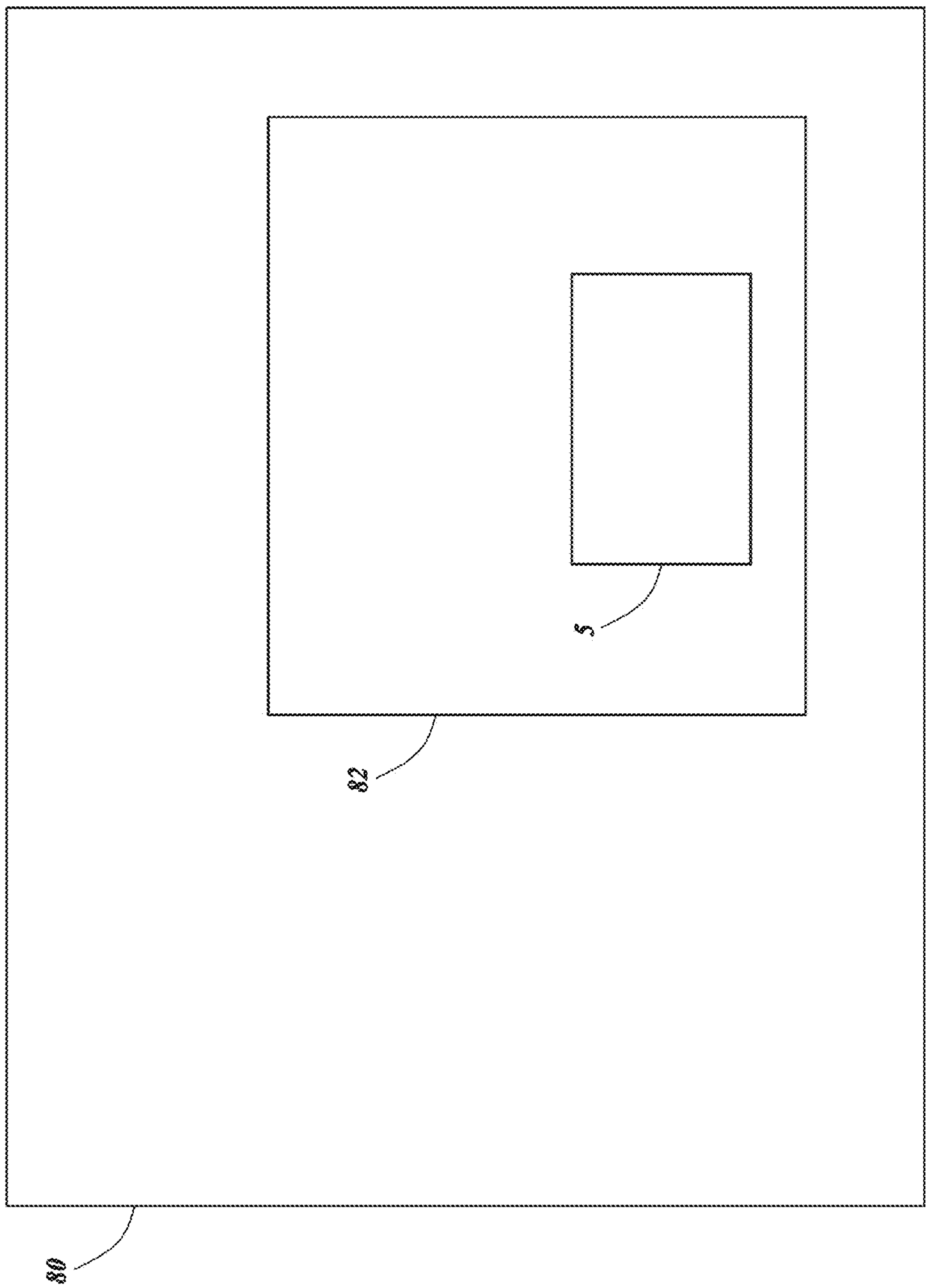
FIG. 4 is a schematic diagram of a system incorporating one or more microelectronic assemblies, according to various embodiments.

FIG. 4 is a schematic diagram of a system 80 incorporating one or more bonded structure 5, according to various embodiments. The system 80 can comprise any suitable type of electronic device, such as a mobile electronic device (e.g., a smartphone, a tablet computing device, a laptop computer, etc.), a desktop computer, an automobile or components thereof, a stereo system, a medical device, a camera, or any other suitable type of system. In some embodiments, the electronic device can comprise a microprocessor, a graphics processor, an electronic recording device, or digital memory. The system 80 can include one or more device packages 82 which are mechanically and electrically connected to the system 80, e.g., by way of one or more motherboards. Each package 82 can comprise one or more bonded structures 5. The bonded structures 5 shown in FIG. 4 can comprise any of the bonded structure disclosed herein. The bonded structure 5 can include one or more integrated device dies which perform various functions for the system 80.

In one embodiment, a bonded structure is disclosed. The bonded structure can include an interconnect structure that has conductors at least partially embedded in a non-conductive material and an upper surface. The upper surface includes a first conductive pad, a second conductive pad, and a non-conductive region. The bonded structure can also include a first integrated device die that has a first bonding surface. The first bonding surface includes a first conductive bond pad and a first non-conductive material. The first conductive bond pad is directly bonded to the first conductive pad without an intervening adhesive. The first non-conductive material can be directly bonded to a first portion of the non-conductive region. The bonded structure can further include a second integrated device die that is mounted to the interconnect structure. The second integrated device die can be spaced apart from the first integrated device die laterally along the upper surface of the interconnect structure. The second integrated device die can be electrically connected with the first integrated device die through at least the interconnect structure. The bonded structure can further include a dielectric layer that is disposed over the upper surface of the interconnect structure between the first integrated device die and the second integrated device die.

In one embodiment, the bonded structure further includes a molding material positioned over the dielectric layer between the first integrated device die and the second integrated device die.

In one embodiment, the dielectric layer has a coefficient of thermal expansion (CTE) lower than a CTE of the molding material In one embodiment, the interconnect structure includes a transfer redistribution layer (RDL).

In one embodiment, the dielectric layer comprises a silicon oxide layer.

In one embodiment, the dielectric layer is disposed between the molding material and the first integrated device die and between the molding material and a portion of the upper surface of the interconnect structure.

In one embodiment, the dielectric layer is disposed along a sidewall of the first integrated device die, a portion of the upper surface of the interconnect structure, and a sidewall of the second integrated device die.

In one embodiment, the first bonding surface of the first integrated device die comprises an active surface of the first integrated device die.

The second integrated device die can include a back side opposite the second bonding surface. The back side of the second integrated device die comprises an active surface of the second integrated device die.

In one embodiment, the bonded structure further includes a support structure that is coupled to the first integrated device die and the second integrated device die such that the first integrated device die and the second integrated device die are positioned between the interconnect structure and the support structure.

In one embodiment, the interconnect structure includes a first conductive line connected to the first conductive pad by way of a first conductive via, and a second conductive line connected to the second conductive pad by way of a second conductive via.

In one embodiment, the second integrated device die comprises a second bonding surface. The second bonding surface can include a second conductive bond pad and a second non-conductive material. The second conductive bond pad can be bonded to the second conductive pad. The second non-conductive material can be bonded to a second portion of the non-conductive region that is different from the first portion.

In one embodiment, the second conductive bond pad is directly bonded to the second conductive pad without an intervening adhesive, and the second non-conductive material is directly bonded to a second portion of the non-conductive region different from the first portion without an intervening adhesive.

In one aspect, a bonded structure is disclosed. The bonded structure can include an interconnect structure that has conductors at least partially embedded in a non-conductive material and an upper surface. The upper surface includes a first conductive pad, a second conductive pad in electrical communication with the first conductive pad, and a non-conductive region. The bonded structure can also include a first integrated device die that has a first bonding surface. The first bonding surface can include a first conductive bond pad and a first non-conductive material. The first conductive bond pad can be directly bonded to the first conductive pad without an intervening adhesive. The first non-conductive material can be directly bonded to a first portion of the non-conductive region. The bonded structure can also include a second integrated device die that is mounted to the interconnect structure. The second die can be spaced apart from the first integrated device die laterally along the upper surface of the interconnect structure. The bonded structure can also include a molding material that is disposed between the first integrated device die and the second integrated device die. The bonded structure can further include a dielectric layer that is disposed at least between the molding material and the first integrated device die or between the molding material and the upper surface of the interconnect structure.

In one embodiment, the dielectric layer has a coefficient of thermal expansion that is (CTE) lower than a CTE of the molding material In one embodiment, the interconnect structure comprises a transfer redistribution layer (RDL).

In one embodiment, the dielectric layer includes a silicon oxide layer.

In one embodiment, the dielectric layer is disposed between the molding material and the first integrated device die and between the molding material and a portion of the upper surface of the interconnect structure. The dielectric layer can be disposed along a sidewall of the first integrated device die, a portion of the upper surface of the interconnect structure, and a sidewall of the second integrated device die.

In one embodiment, the first bonding surface of the first integrated device die includes an active surface of the first integrated device die. The second integrated device die can include a back side opposite the second bonding surface. The back side of the second integrated device die can include an active surface of the second integrated device die.

In one embodiment, the bonded structure further includes a support structure that is coupled to the first integrated device die and the second integrated device die such that the first integrated device die and the second integrated device die are positioned between the interconnect structure and the support structure.

In one embodiment, the interconnect structure includes a first conductive line connected to the first conductive pad by way of a first conductive via, and a second conductive line connected to the second conductive pad by way of a second conductive via.

In one embodiment, the second die comprises a second bonding surface. The second bonding surface can include a second conductive bond pad and a second non-conductive material. The second conductive bond pad can be bonded to the second conductive pad, and the second non-conductive material can be bonded to a second portion of the non-conductive region different from the first portion. The second conductive bond pad can be directly bonded to the second conductive pad without an intervening adhesive, and the second non-conductive material can be directly bonded to a second portion of the non-conductive region different from the first portion without an intervening adhesive.

In one embodiment, the second integrated device die is electrically connected with the first integrated device die at least partially through the interconnect structure.

In one embodiment, a method of manufacturing a bonded structure is disclosed. The method can include providing an interconnect structure that has conductors at least partially embedded in a non-conductive material and an upper surface. The upper surface includes a first conductive pad, a second conductive pad, and a non-conductive region. The method can also include directly bonding a first integrated device die to the interconnect structure. The first integrated device die has a first bonding surface. The first bonding surface can include a first conductive bond pad and a first non-conductive material. The first conductive bond pad can be directly bonded to the first conductive pad without an intervening adhesive, and the first non-conductive material can be directly bonded to a first portion of the non-conductive region. The method can also include directly bonding a second integrated device die to the interconnect structure. The second integrated device die can be spaced apart from the first integrated device die laterally along the upper surface of the interconnect structure. The second integrated device die can be electrically connected with the first integrated device die through at least the interconnect structure. The method can also include forming a dielectric layer over at least a portion of the upper surface of the interconnect structure. The method can further include disposing a molding material over at least a portion of the dielectric layer.

In one embodiment, forming the interconnect structure includes forming the interconnect structure on a carrier. The method can further include removing the carrier from the interconnect structure after mounting the first integrated device die.

In one embodiment, forming the dielectric layer include forming the dielectric layer along a sidewall of the first die, a portion of the upper surface, and a sidewall of the second die.

In one aspect, a bonded structure is disclosed. The bonded structure can include an interconnect structure that has conductors at least partially embedded in a non-conductive material and a upper surface. The upper surface includes a first conductive pad, a second conductive pad, and a non-conductive region between the first conductive pad and the second conductive pad. The bonded structure can also include a first die that has a first bonding surface. The first bonding surface can include a first conductive bond pad and a first non-conductive material. The first bonding surface of the first die can include an active surface of the first die. The first conductive bond pad can be directly bonded to the first conductive pad without an intervening adhesive, and the first non-conductive material can be directly bonded to a first portion of the non-conductive region. The bonded structure can also include a second die that has a second bonding surface facing the interconnect structure. The second die can be mounted to the interconnect structure. The second die can be spaced apart from the first die laterally along the upper surface of the interconnect structure. The second die includes a back side opposite the second bonding surface. The back side of the second die can include an active surface of the second die. The bonded structure can also include a molding material disposed between the first die and the second die. The bonded structure can further include a silicon oxide layer that is disposed between the molding material and the first die or between the molding material and the upper surface of the interconnect structure.

In one embodiment, the interconnect structure includes a redistribution layer, and the first die and the second die are electrically connected with each other at least partially through the interconnect structure.

In one embodiment, the silicon oxide layer is disposed between the molding material and the first die and between the molding material and a portion of the upper surface of the interconnect structure.

In one embodiment, the silicon oxide layer is disposed along a sidewall of the first die, a portion of the upper surface, and a sidewall of the second die.

In one embodiment, the interconnect structure includes a first conductive line connected to the first conductive pad by way of a first conductive via, and a second conductive line connected to the second conductive pad by way of a second conductive via.

In one embodiment, the second bonding surface includes a second conductive bond pad and a second non-conductive material, the second conductive bond pad bonded to the second conductive pad, and the second non-conductive material bonded to a second portion of the non-conductive region different from the first portion.

In one aspect, a bonded structure is disclosed. The bonded structure can include an interconnect structure that has conductors at least partially embedded in a non-conductive material and a upper surface. The upper surface can include a first conductive pad, a second conductive pad, and a non-conductive region surrounding the first conductive pad and the second conductive pad. The bonded structure can also include a first die having a first bonding surface. The first bonding surface can include a first conductive bond pad and a first non-conductive material surrounding the first conductive bond pad. The first bonding surface of the first die can include an active surface of the first die. The first conductive bond pad can be directly bonded to the first conductive pad, and the first non-conductive material can be directly bonded to a first portion of the non-conductive region. The bonded structure can also include a second die that has a second bonding surface facing the interconnect structure. The second die can be mounted to the interconnect structure. The second die can be spaced apart from the first die laterally along the upper surface of the interconnect structure. The bonded structure can further include a molding material disposed between the first die and the second die. A width of the molding material is less than 20% of a width of the first die or second die.

In one aspect, a bonded structure is disclosed. the bonded structure can include an interconnect structure that has conductors at least partially embedded in a non-conductive material and a upper surface. The upper surface includes a first conductive pad, a second conductive pad, and a non-conductive region surrounding the first conductive pad and the second conductive pad. The bonded structure can also include a first die that has a first bonding surface. The first bonding surface can include a first conductive bond pad and a first non-conductive material surrounding the first conductive bond pad. The first bonding surface of the first die can include an active surface of the first die. The first conductive bond pad can be directly bonded to the first conductive pad, and the first non-conductive material can be directly bonded to a first portion of the non-conductive region. The bonded structure can further include a second die that has a second bonding surface facing the interconnect structure. The second die can be mounted to the interconnect structure. The second die can be spaced apart from the first die laterally along the upper surface of the interconnect structure. A thickness of the interconnect structure is thinner than a thickness of the first die or the second die. The thickness of the interconnect structure can be less than 50% of the thickness of the first die or the second die.

Unless the context clearly requires otherwise, throughout the description and the claims, the words "comprise," "comprising," "include," "including" and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Likewise, the word "connected", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description using the singular or plural number may also include the plural or singular number respectively. The word "or" in reference to a list of two or more items, that word covers all of the following interpretations of the word: any of the items in the list, all of the items in the list, and any combination of the items in the list.

Moreover, conditional language used herein, such as, among others, "can," "could," "might," "may," "e.g.," "for example," "such as" and the like, unless specifically stated otherwise, or otherwise understood within the context as used, is generally intended to convey that certain embodiments include, while other embodiments do not include, certain features, elements and/or states. Thus, such conditional language is not generally intended to imply that features, elements and/or states are in any way required for one or more embodiments.

While certain embodiments have been described, these embodiments have been presented by way of example only, and are not intended to limit the scope of the disclosure. Indeed, the novel apparatus, methods, and systems described herein may be embodied in a variety of other forms; furthermore, various omissions, substitutions and changes in the form of the methods and systems described herein may be made without departing from the spirit of the disclosure. For example, while blocks are presented in a given arrangement, alternative embodiments may perform similar functionalities with different components and/or circuit topologies, and some blocks may be deleted, moved, added, subdivided, combined, and/or modified. Each of these blocks may be implemented in a variety of different ways. Any suitable combination of the elements and acts of the various embodiments described above can be combined to provide further embodiments. The accompanying claims and their equivalents are intended to cover such forms or modifications as would fall within the scope and spirit of the disclosure.

What is claimed is:

1. A method of manufacturing a bonded structure, the method comprising:

providing an interposer element having an upper surface at a first side and a lower surface at a second side, wherein the upper surface comprises a first conductive pad, a second conductive pad, and a non-conductive region, and wherein the lower surface is supported by a carrier;

directly bonding a first die comprising integrated circuitry to the interposer element, the first die having a first bonding surface, the first bonding surface comprising a first conductive bond pad and a first non-conductive material, the first conductive bond pad directly bonded to the first conductive pad without an intervening adhesive, and the first non-conductive material directly bonded to a first portion of the non-conductive region;

directly bonding a second die comprising integrated circuitry to the interposer element, the second die spaced apart from the first die laterally along the upper surface of the interposer element by a gap, the second die electrically connected with the first die through at least the interposer element;

conformally depositing a first insulating layer over the upper surface of the interposer element and the first and second dies;

disposing a second insulating layer over the first insulating layer to fill the gap;

planarizing the first and second insulating layers and the first and second dies;

attaching a support structure over the planarized first and second insulating layers and the first and second dies;

removing the carrier; and attaching the second side of the interposer element to a substrate, the substrate comprising a semiconductor die.

2. The method of claim 1, wherein attaching the support structure comprises attaching a silicon wafer over the planarized first and second insulating layers and first and second dies.

3. The method of claim 1, wherein the first insulating layer has a coefficient of thermal expansion less than 10 ppm/° C.

4. The method of claim 3, wherein the first insulating layer has a coefficient of thermal expansion less than 6 ppm/° C.

5. The method of claim 1, wherein the substrate comprises conductive vias extending through the substrate.

6. The method of claim 5, wherein the conductive vias provide electrical connection to the first and second dies through the interposer element.

7. The method of claim 5, further comprising, after disposing the second insulating layer, singulating through the second insulating layer.

8. The method of claim 1, wherein the interposer element comprises a redistribution layer (RDL).

9. A method of manufacturing a bonded structure, the method comprising:

providing an interposer element having an upper surface at a first side and a lower surface at a second side, wherein the upper surface comprises a first conductive pad, a second conductive pad, and a non-conductive region, and wherein the lower surface is supported by a carrier;

directly bonding a first die comprising integrated circuitry to the interposer element, the first die having a first bonding surface, the first bonding surface comprising a first conductive bond pad and a first non-conductive material, the first conductive bond pad directly bonded to the first conductive pad without an intervening adhesive, and the first non-conductive material directly bonded to a first portion of the non-conductive region;

directly bonding a second die comprising integrated circuitry to the interposer element, the second die spaced apart from the first die laterally along the upper surface of the interposer element by a gap;

providing a conformal dielectric coating over top surfaces of the first and second dies and over the upper surface of the interposer element;

disposing an encapsulant over the conformal dielectric coating to fill the gap;

removing portions of at least the conformal dielectric coating and the encapsulant to planarize the conformal dielectric material, the encapsulant, and the first and second dies;

attaching a support structure over the planarized conformal dielectric material, the encapsulant, and the first and second dies;

removing the carrier; and attaching the second side of the interposer element to a substrate.

10. The method of claim 9, further comprising performing only one planarization step to the first and second dies, the only one planarization step causing top surfaces of the first and second dies to be flush with at least the encapsulant, wherein performing the only one planarization step comprises removing the portions of at least the conformal dielectric coating and the encapsulant.

11. The method of claim 9, wherein attaching the support structure comprises attaching a silicon wafer over the planarized first and second dies.

12. The method of claim 9, wherein the conformal dielectric coating has a coefficient of thermal expansion less than 10 ppm/° C.

13. The method of claim 12, wherein the conformal dielectric coating has a coefficient of thermal expansion less than 6 ppm/° C.

14. The method of claim 9, wherein the substrate comprises conductive vias extending through the substrate.

15. The method of claim 9, further comprising, after disposing the encapsulant, singulating through the encapsulant.

16. The method of claim 9, wherein the substrate comprises a semiconductor die.

17. A method of manufacturing a bonded structure, the method comprising:

providing a reconstituted wafer comprising:

a carrier and a routing structure on the carrier, the routing structure comprising a nonconductive material, a plurality of conductive lines in the nonconductive material, and a plurality of conductive vias extending at least partially through the nonconductive material;

a first die hybrid bonded to the routing structure, the first die comprising integrated circuitry;

a second die hybrid bonded to the routing structure, the second die comprising integrated circuitry, the second die electrically connected with the first die through at least the routing structure; and an insulating material over the routing structure and in which the first and second dies are at least partially embedded, wherein the insulating material comprises a first conformal dielectric layer over at least the routing structure and a second encapsulant over the first conformal dielectric layer;

planarizing the insulating material and the first and second dies;

attaching a support structure over the planarized insulating material and the first and second dies;

removing the carrier; and attaching the routing structure to a substrate, the substrate comprising a semiconductor die.

18. The method of claim 17, wherein the substrate comprises conductive vias extending through the substrate.

19. The method of claim 17, wherein the substrate comprises a semiconductor die.

20. The method of claim 17, wherein attaching the support structure comprises attaching a silicon wafer over the planarized first and second dies.

* * * * *